(12) United States Patent
Pantano et al.

(10) Patent No.: US 9,160,159 B2
(45) Date of Patent: Oct. 13, 2015

(54) CIRCUIT BREAKER AND METHOD OF CONTROLLING A POWER TRANSISTOR WITH A CIRCUIT BREAKER

(71) Applicant: STMicroelectronics S.r.l., Agrate Brianza (IT)

(72) Inventors: Salvatore Pantano, Pedara (IT); Marco Martini, Acireale (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/340,031

(22) Filed: Jul. 24, 2014

(65) Prior Publication Data

US 2015/0028935 A1 Jan. 29, 2015

(30) Foreign Application Priority Data

Jul. 24, 2013 (IT) .............................. MI2013A1238

(51) Int. Cl.
*H02H 3/08* (2006.01)
*H02H 1/00* (2006.01)

(52) U.S. Cl.
CPC .............. *H02H 3/08* (2013.01); *H02H 1/0092* (2013.01); *H03K 2217/0027* (2013.01)

(58) Field of Classification Search
USPC ................................................ 327/365–508
See application file for complete search history.

(56) References Cited

U.S. PATENT DOCUMENTS

| | | | |
|---|---|---|---|
| 4,811,154 A | 3/1989 | Trenkler et al. | |
| 5,225,765 A * | 7/1993 | Callahan et al. | 323/235 |
| 5,319,301 A * | 6/1994 | Callahan et al. | 323/235 |
| 6,275,395 B1 * | 8/2001 | Inn et al. | 363/60 |
| 6,492,798 B2 * | 12/2002 | Sunter | 324/76.15 |
| 6,900,621 B1 * | 5/2005 | Gunther | 323/266 |
| 6,914,472 B2 * | 7/2005 | Rosnell | 327/407 |
| 7,554,305 B2 * | 6/2009 | Nunokawa et al. | 323/273 |
| 7,855,535 B2 * | 12/2010 | Tiew et al. | 323/274 |
| 2005/0007178 A1 * | 1/2005 | Fahim | 327/390 |
| 2008/0067998 A1 * | 3/2008 | Lee et al. | 323/354 |
| 2009/0295355 A1 * | 12/2009 | Hirahara | 323/284 |
| 2010/0264961 A1 * | 10/2010 | Onishi | 327/156 |
| 2011/0148509 A1 * | 6/2011 | Pan | 327/536 |
| 2011/0291735 A1 * | 12/2011 | Thirugnanasambandham et al. | 327/365 |
| 2012/0032728 A1 * | 2/2012 | Coleman et al. | 327/434 |
| 2014/0197884 A1 * | 7/2014 | Cohen | 327/543 |
| 2015/0109161 A1 * | 4/2015 | Trampitsch | 341/172 |

FOREIGN PATENT DOCUMENTS

WO 2010011475 1/2010

OTHER PUBLICATIONS

Search Report for Italian patent application No. MI20131238; Munich, Germany; May 22, 2014, 2 pages.

* cited by examiner

*Primary Examiner* — Brandon S Cole
(74) *Attorney, Agent, or Firm* — Allen, Dyer, Doppelt, Milbrath & Gilchrist, P.A.

(57) ABSTRACT

An embodiment of an apparatus, such as a circuit breaker, includes an input node, an output node, and a digital circuit. The input node is configured to receive an input voltage, and the output node is coupled to the input node and is configured to carry an output current. And the digital circuit is configured to uncouple the output node from the input node in response to a power drawn from the input node exceeding a threshold.

16 Claims, 5 Drawing Sheets

CIRCUIT BREAKER AND METHOD OF CONTROLLING A POWER TRANSISTOR WITH A CIRCUIT BREAKER

PRIORITY CLAIM

The instant application claims priority to Italian Patent Application No. MI2013A001238, filed 24 Jul. 2013, which application is incorporated herein by reference in its entirety.

TECHNICAL FIELD

The present disclosure relates to circuits for disconnecting a load, and more particularly to a circuit breaker, that implements a related method, adapted to control a power transistor for disconnecting a supplied load from a power line when the power absorbed by the load exceeds a maximum value.

SUMMARY

Circuit breakers are widely used for protecting circuits against excessive power delivery, for example, due to accidental short-circuits of a supplied load. A basic circuit breaker is depicted in FIG. 1. It includes:
- a power transistor M1, that may be a MOSFET or a BJT, inserted in a power line from an input terminal IN to an output terminal OUT of the circuit breaker,
- a current sensor, that may be realized as shown in the figure with a sense resistor Rsense, inserted such as to be crossed by the current delivered by the power transistor M1, and with a reader CURRENT SENSE of the voltage drop V1 on the sense resistor,
- a resistive voltage divider R1, R2 coupled between the power line and a ground node to generate on its center tap a scaled replica V2 of the supply voltage on the power line (i.e., of the voltage on the input terminal IN),
- an analog multiplier X configured to generate an analog product voltage V3, representative of the power entering in the circuit breaker as the product of the analog voltage V1, proportional to the current IN entering in the circuit breaker through the input terminal IN, by the scaled replica voltage V2,
- an analog comparator with hysteresis COMP, configured to compare the analog product voltage V3 with a threshold voltage VTHR representative of a pre-established maximum power level, generating a control signal for turning off the power transistor M1 when the pre-established maximum power level is exceeded.

Optionally, the threshold voltage VTHR may be generated by a current-to-voltage converter I_TO_V_CONVERTER that converts into voltage the current flowing throughout a reference resistor Rset coupled between the input terminal IN and a reference terminal RSET of the circuit breaker, as shown in the figure.

The analog multiplier X is typically realized with the architecture of FIG. 2. Two functional blocks LOG(.) with a logarithmic characteristic are configured to receive in input the voltages V1 and V2 and to generate logarithmic replicas of the voltages V1 and V2, respectively; an analog adder Σ generates the sum of the logarithmic replica voltages, and a functional block E(.) with an exponential characteristic generates the product voltage V3. The functional blocks LOG(.) and E(.) are typically based on diodes or BJTs and exploit voltage-current characteristics of P-N junctions, that is:

$$i = I_S \cdot (\exp(v/V_T) - 1)$$

wherein i is the current throughout the P-N junction, $I_S$ is the saturation current, v is the direct voltage across the P-N junction and $V_T$ is the voltage-equivalent of temperature.

The functional blocks are relatively inaccurate, because of mismatches between the blocks LOG(.) with a logarithmic characteristic and also because of intrinsic offsets of analog operational amplifiers included in the functional blocks, and have a typical accuracy of about 3%. Accuracy may be improved by adding trimming cells to the shown architecture and by performing a trimming step.

But it has been found that it may be inconvenient to use the above architecture for realizing circuit breakers of enhanced accuracy, for example, of 1% or better, as requested, for example, in applications for notebooks. Indeed, for obtaining a good accuracy, a great number of trimming cells would be requested and they would occupy a relatively large silicon area. Moreover, the time required for testing the whole circuit breaker would increase rapidly with the number of trimming cells.

Instead of following the actual trend of research, it has been found expedient to pursue a different strategy, a circuit breaker capable of sensing with great accuracy the power absorbed by a supplied load without requiring area consuming trimming cells.

This outstanding result has been attained with a circuit breaker having a substantially digital architecture instead of an analog architecture. More precisely, an embodiment of the circuit breaker of this disclosure includes:
- an input terminal,
- an output terminal,
- a power transistor inserted in a power line of the circuit breaker between the input terminal and the output terminal, controlled in operation by a control signal,
- a current sensor and a voltage sensor coupled to the power line such to generate respective voltages first and second representing a delivered current and a supply voltage on the power line, respectively,
- an internal line on which a reference voltage representative of a maximum power is made available,
- an analog-to-digital converter configured to convert in parallel or in a serial fashion the voltages first and second and the reference voltage,
- respective memory devices functionally coupled to the analog-to-digital converter to store respective digital words representing said voltages first and second and the reference voltage, and
- a digital decision circuit configured to process the digital words stored in the memory devices and to generate the control signal for turning on/off the power transistor.

A method of controlling a power transistor with a circuit breaker according to an embodiment is also disclosed.

DETAILED DESCRIPTION

Figure 3:
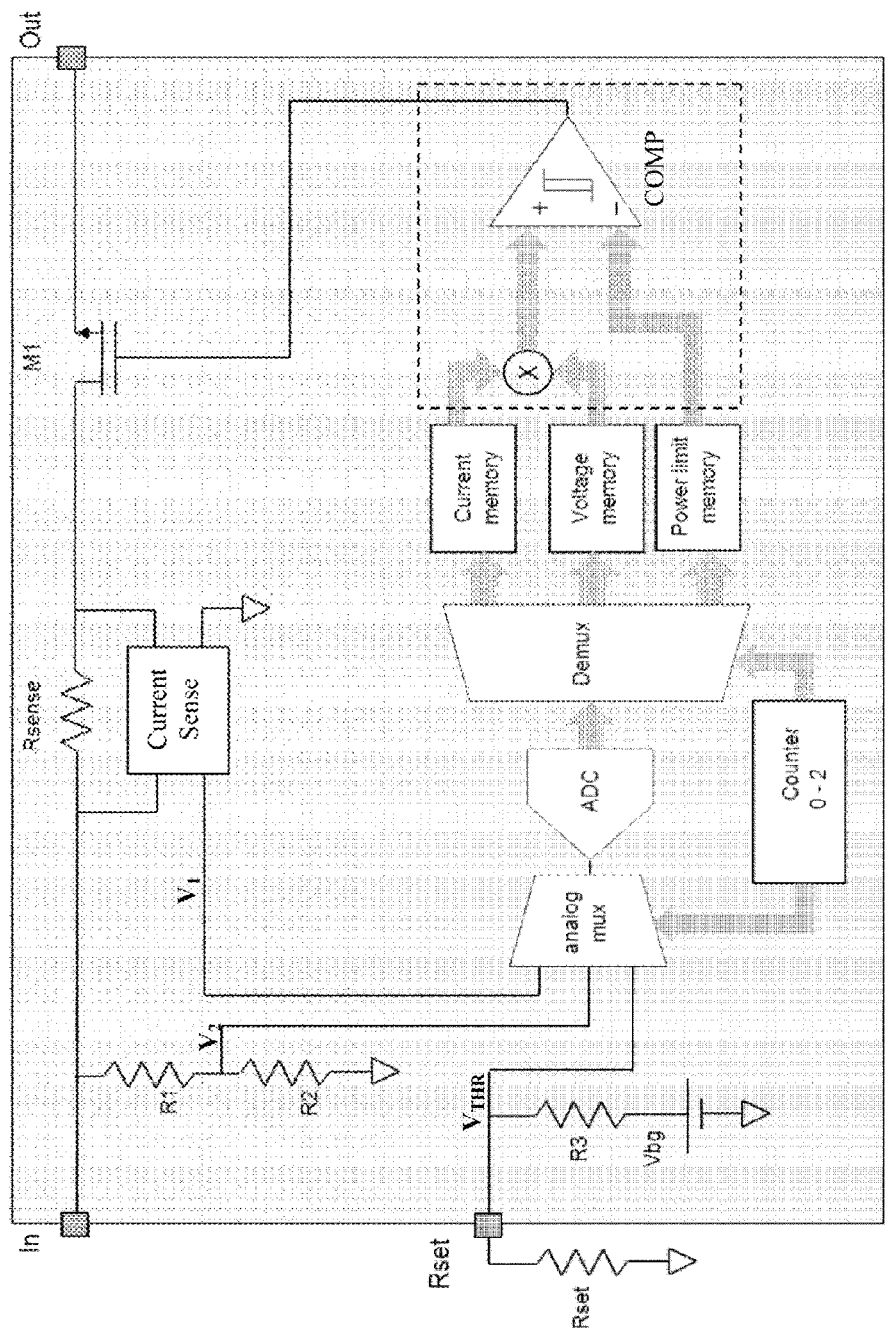
FIG. 3 depicts a circuit breaker of this disclosure according to an embodiment.

An exemplary block architecture of a circuit breaker of this disclosure is shown in FIG. 3. It includes a power transistor M1 inserted in a power line of the circuit breaker between an input terminal IN and an output terminal OUT, a current sensor and a voltage sensor coupled to the power line such as to generate voltages V1 and V2 representing the current and the voltage relative to ground, respectively, provided in input to the circuit breaker.

It is also shown an optional reference circuit for generating on an internal line a reference voltage VTHR, representative of a maximum power, by cooperating with a resistor Rset coupled between the input terminal IN and a reference terminal RSET of the circuit breaker. As an alternative, the reference voltage may be provided on the reference terminal or may be internally generated by a dedicated circuit embedded in the circuit breaker.

Figure 1:
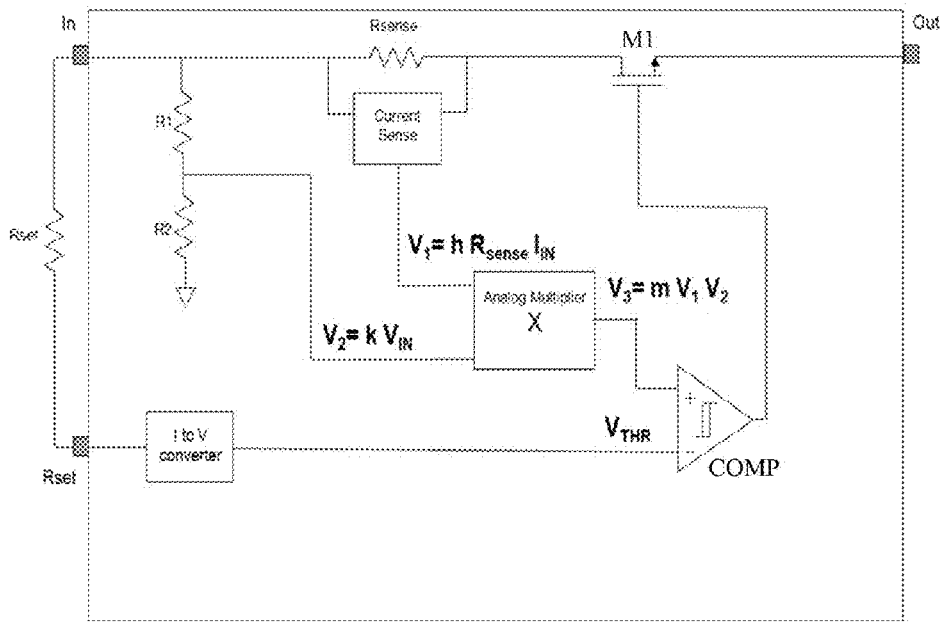
FIG. 1 depicts a known circuit breaker composed of analog components.
Figure 2:
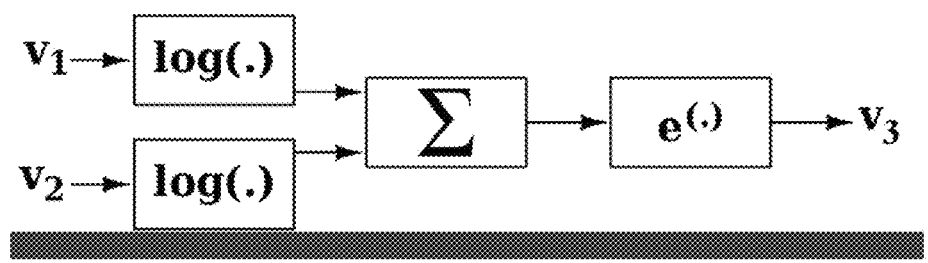
FIG. 2 depicts functional circuit blocks of a typical analog multiplier.

Differently from the circuit breaker of FIG. 1, the architecture of FIG. 3 includes an analog-to-digital converter ADC configured to convert in parallel or in a serial fashion the voltages V1, V2 and VTHR; respective memory devices CURRENT MEMORY, VOLTAGE MEMORY, POWER LIMIT MEMORY, functionally coupled to the analog-to-digital converter ADC to store respective digital values; and a digital decision circuit, enclosed in dashed line, that processes the digital words stored in the memory devices and generates a control signal for the power transistor M1 with a level adapted to turn it on/off depending on the values stored in the memory devices and on a desired control action to be implemented.

In the shown exemplary embodiment, the digital decision circuit is composed of a digital multiplier X, configured to generate a product value representative of the input power as the product between the delivered current and the supply voltage on the power line, and a hysteresis comparator COMP for generating the control voltage of the power transistor M1 depending on the comparison of the input power with its maximum level stored in the respective memory device POWER LIMIT MEMORY.

The reference voltage VTHR may be generated by a bandgap circuit Vbg coupled to a bias resistor R3 and to an external reference resistor Rset coupled to a reference terminal RSET of the circuit breaker.

In the embodiment shown in FIG. 3, the voltages V1, V2, and VTHR are processed in a serial fashion using a multiplexer ANALOG MUX that provides in input to the analog-to-digital converter ADC the voltages to be converted, and with a demultiplexer DEMUX that stores the digital words representing the voltages V1, V2, and VTHR in the corresponding memory device CURRENT MEMORY, VOLTAGE MEMORY, and POWER LIMIT MEMORY, respectively. A counter COUNTER 0-2 generates appropriate selection commands for the analog multiplexer and the digital demultiplexer for storing the digital words in the respective memory devices.

The digital part of the circuit breaker, that includes the multiplexer, the analog-to-digital converter, the demultiplexer, the memory devices, the counter, and the decision circuit, occupies a negligible silicon area in respect to the power transistor M1 and in respect to the set of trimming cells that would be required in an analog circuit breaker of FIG. 1 for obtaining the same accuracy. Moreover, it is possible to implement any kind of control characteristic for deciding in which condition the power transistor M1 is to be turned off/on by substituting the shown decision circuit with a programmable device.

The circuit breaker shown in FIG. 3 implements cyclically the following method steps:

sensing a delivered current flowing throughout the power line of the circuit breaker generating a corresponding analog current sense signal;

converting the analog current sense signal into a corresponding digital value by means of the analog-to-digital converter and storing the digital value in the first memory device;

sensing a supply voltage on the power line of the circuit breaker generating a corresponding analog voltage sense signal;

converting the analog voltage sense signal into a corresponding digital value by means of the analog-to-digital converter and storing the digital value in the second memory device;

converting a reference voltage on the internal line of the circuit breaker into a corresponding digital value by means of the analog-to-digital converter and storing the digital value in the third memory device;

generating a product value representative of a value of power provided in input to the circuit breaker as the product of the digital values stored in the memory devices first and second;

comparing the product value with the digital value stored in the third memory device; and generating the control signal for the power transistor with a level adapted to turn it off when the product between the delivered current and the supply voltage exceeds the maximum power level.

Figure 4:
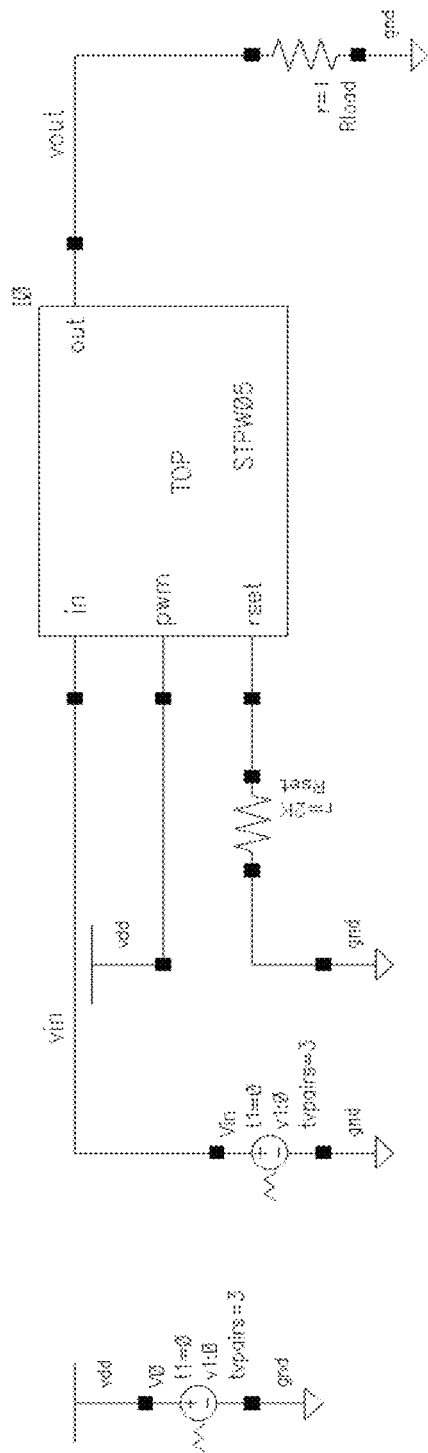
FIG. 4 is a simulation circuit of a circuit breaker according to this disclosure, used for simulations, according of an embodiment.

FIG. 4 shows a simulation circuit of the circuit breaker of FIG. 3 in which the values of the components used for obtaining simulation graphs are shown merely by way of example. There is also a clock input PWM for providing from outside a clock signal for clocking the digital part of the circuit breaker. The depicted circuit breaker is configured to stop supplying the load, that in the shown exemplary embodiment is a 1Ω resistor, when a power greater than 7.5 W is absorbed by the load.

Figure 5:
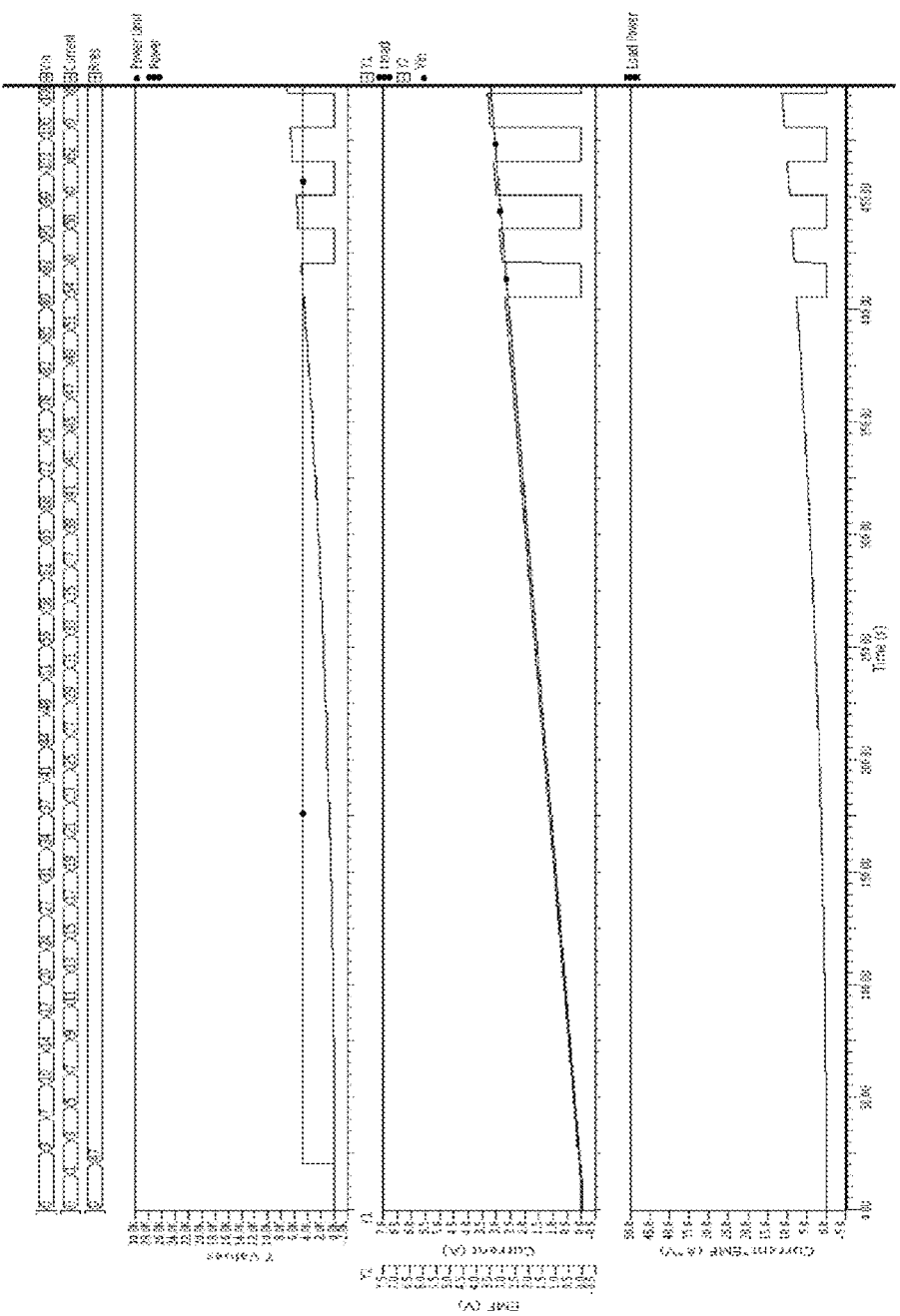
FIGS. 5 and 6 are time graphs that illustrate the functioning of the simulation circuit of FIG. 4, according to an embodiment.
Figure 6:
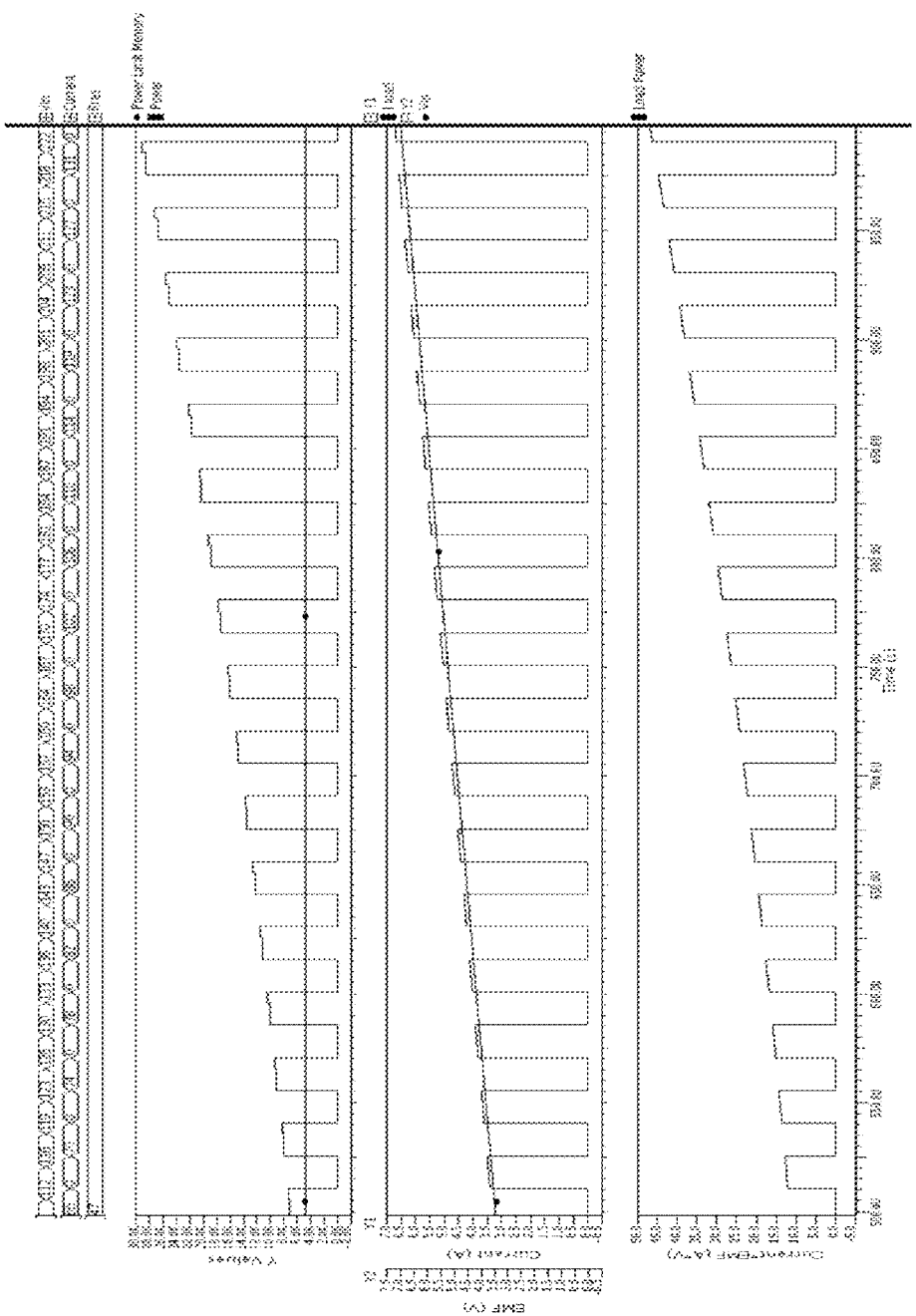

Simulation time graphs of the circuit of FIG. 4 are shown in FIGS. 5 and 6. In the interval from 0 to 420 μs, the power absorbed by the load Load Power is smaller than 7.5 W, thus the load is supplied. The product value Power, calculated from the digital values corresponding to the load current Iload and the input voltage Vin (represented in digital format by the signals Current and Vin on the top graph of FIGS. 5 and 6), is compared with the maximum power level Power Limit, defined by the reference resistor Rset.

When Power exceeds Power Limit, that in the considered case is 7.5 W, the load is disconnected and the value of Power becomes 0 at the next PWM period. After a fixed delay, the load is coupled again for another PWM period. Since the power absorbed by the load is greater than the maximum power level, the value of Power will exceed again the maximum power level Power Limit and the load is disconnected again at the next PWM period.

An embodiment of the herein disclosed circuit breaker has numerous advantages, among which:

Improved threshold precision: it depends only by the accuracy of the sensing circuitry (Current Sense) and of the analog-to-digital converter ADC. In the prior analog approach, the accuracy of the comparison with the maximum power level depends upon offsets of operational amplifiers used in the voltage multiplier and in the hysteresis comparator. By contrast, in an embodiment of the circuit breaker disclosed herein, all operations are executed in a digital domain, relatively free of errors;

High flexibility of the design: an eventual modification of the control action in a digital environment is typically faster and more secure than a modification in an analog environment;

Silicon area reduction: no trimming cell is required for attaining an enhanced accuracy;

No need of an external appliance to program the circuit breaker, since it may be done by means of a digital interface (SPI, I2C).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
   an input node configured to receive an input voltage;
   an output node coupled to the input node and configured to carry an output current;
   a generator configured to generate a threshold signal that represents a threshold voltage;
   a current sensor configured to generate a sense voltage that represents the output current;
   an analog-to-digital converter configured to convert the input voltage, the sense voltage, and the threshold signal into a digital voltage value, a digital sense-voltage value, and a digital threshold value, respectively;
   a multiplexer configured to selectively couple the threshold signal, the input voltage, and the sense voltage to the analog-to-digital converter; and
   a digital circuit coupled to the analog-to-digital converter and configured to uncouple the output node from the input node in response to a digital product of the digital voltage value and the digital sense-voltage value exceeding the digital threshold value.

2. The apparatus of claim 1 wherein the output node is configured to provide the output current to a load.

3. The apparatus of claim 1,
   wherein the digital circuit comprises:
   a multiplier configured to generate the digital product of the digital voltage value and the digital sense-voltage value, and
   a comparator configured to compare the digital product to the digital threshold value.

4. The apparatus of claim 3, wherein the analog-to-digital converter is configured to convert the input voltage into the digital voltage value by converting a representation of the input voltage into the digital voltage value.

5. The apparatus of claim 4, wherein the representation of the input voltage has a magnitude that is less than the input voltage.

6. The apparatus of claim 1, further comprising:
   a switch coupled between the input and output nodes and configured to carry the output current; and
   wherein the digital circuit is configured to uncouple the output node from the input node by opening the switch in response to the digital product exceeding the digital threshold value.

7. The apparatus of claim 1, further comprising:
   a transistor coupled between the input and output nodes and configured to carry the output current; and
   wherein the digital circuit is configured to uncouple the output node from the input node by deactivating the transistor in response to the digital product exceeding the digital threshold value.

8. The apparatus of claim 1, further comprising:
   a memory configured to store the digital voltage value, digital sense-voltage value, and the digital threshold value;
   a demultiplexer configured to selectively couple the digital voltage value, digital sense-voltage value, and digital threshold value from the analog-to-digital converter to the memory; and
   wherein the digital circuit includes
   a multiplier configured to receive the digital voltage value and the digital sense-voltage value from the memory and to generate the digital product of the digital voltage value and the digital sense-voltage value, and
   a comparator configured to receive the digital threshold value from the memory and to compare the digital product to the digital threshold value, and to uncouple the output node from the input node in response to the digital product exceeding the digital threshold value.

9. The apparatus of claim 8, further comprising:
   a switch coupled between the input and output nodes and configured to carry the output current.

10. The apparatus of claim 8, further comprising:
    a transistor coupled between the input and output nodes and configured to carry the output current.

11. A system, comprising:
    a load; and
    a circuit breaker, including
    an input node configured to receive an input voltage;
    an output node coupled to the input node and configured to provide an output current to the load;
    a generator configured to generate a threshold signal that represents a threshold;
    a current sensor configured to generate a sense voltage that represents the output current;
    an analog-to-digital converter configured to convert the input voltage, the sense voltage, and the threshold signal into a digital voltage value, a digital sense-voltage value, and a digital threshold value, respectively; and
    a multiplexer configured to selectively couple the threshold signal, the input voltage, and the sense voltage to the analog-to-digital converter; and
    a digital circuit configured to uncouple the output node from the input node in response to a product of the digital voltage value and the digital sense-voltage value exceeding the digital threshold value.

12. The system of claim 11, wherein the circuit breaker includes an integrated circuit.

13. The system of claim 11, wherein at least a portion of the circuit breaker is disposed on an integrated circuit.

14. A method, comprising:
    providing power from a power source to a load with a circuit breaker that includes digital circuitry;
    generating a threshold signal that represents a threshold;
    generating a sense voltage that represents an output current of the power;
    converting an input voltage of the power, the sense voltage, and the threshold signal into a digital voltage value, a digital sense-voltage value, and a digital threshold value, respectively; and
    selectively coupling the threshold signal, the input voltage, and the sense voltage to an analog-to-digital converter; and
    opening the circuit breaker in response to the digital circuitry determining that the power drawn from the power source exceeds the digital threshold value.

15. The method of claim 14, further comprising determining that the power drawn from the power source exceeds the threshold by:
- determining with the digital circuitry a product of a current to the load and a voltage to the circuit breaker; and
- determining that the product exceeds the threshold.

16. The method of claim 14, further comprising determining that the power drawn from the power source exceeds the threshold by:
- determining with the digital circuitry a product of a representation of a current to the load and a representation of a voltage to the circuit breaker; and
- determining that the product exceeds the threshold.

\* \* \* \* \*